(12) United States Patent
Doehnel et al.

(10) Patent No.: US 8,268,688 B2
(45) Date of Patent: Sep. 18, 2012

(54) PRODUCTION OF VDMOS-TRANSISTORS HAVING OPTIMIZED GATE CONTACT

(75) Inventors: Jochen Doehnel, Erfurt (DE); Siegfried Hering, Kerspleben (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 732 days.

(21) Appl. No.: 11/911,624

(22) PCT Filed: Apr. 10, 2006

(86) PCT No.: PCT/EP2006/061497
§ 371 (c)(1),
(2), (4) Date: Feb. 27, 2009

(87) PCT Pub. No.: WO2006/108827
PCT Pub. Date: Oct. 19, 2006

(65) Prior Publication Data
US 2010/0035366 A1    Feb. 11, 2010

(30) Foreign Application Priority Data
Apr. 13, 2005   (DE) .......................... 10 2005 008 191

(51) Int. Cl.
*H01L 21/66*     (2006.01)
*H01L 21/336*    (2006.01)
(52) U.S. Cl. ............ 438/270; 438/5; 438/153; 438/188; 438/667; 438/700; 257/204; 257/274; 257/288; 257/E21.419; 257/E21.529

(58) Field of Classification Search .............. 438/5, 153, 438/188, 199–233, 637–640, 667, 700, 701; 257/204, 274, 288, 341, 342, 382, 773, 774, 257/E21.419, E21.529, E21.575, E27.062–E27.067, 257/E29.255
See application file for complete search history.

(56) References Cited

U.S. PATENT DOCUMENTS
6,025,646 A         2/2000   Sakai
2003/0190787 A1 *  10/2003   Curro' .......................... 438/278

FOREIGN PATENT DOCUMENTS
DE    19733350          3/1999
WO    WO 96/07200       3/1996
WO    WO2006/108827 A2  10/2006
WO    WO2006/108827 A3  10/2006

OTHER PUBLICATIONS

International Search Report dated Oct. 4, 2006.
International Preliminary Report on Patentability including Written Opinion of the International Searching Authority dated Oct. 30, 2007.
International Search Report for PCT/EP2006/061497, Oct. 18, 2006.

* cited by examiner

*Primary Examiner* — Hsien Ming Lee
*Assistant Examiner* — Walter H Swanson
(74) *Attorney, Agent, or Firm* — Hunton & Williams LLP

(57) ABSTRACT

A method for producing VDMOS transistors in which a specific layer arrangement and a specific method sequence allow setting up an improved gate contact when simultaneously producing source and gate contacts using a single contact hole mask (photo mask).

6 Claims, 4 Drawing Sheets

PRODUCTION OF VDMOS-TRANSISTORS HAVING OPTIMIZED GATE CONTACT

FIELD OF THE INVENTION

The invention relates to a manufacturing method for VDMOS transistors (manufacturing) on a silicon substrate. The invention also relates to a thereby fabricated product in which the steps of the method are recognized.

BACKGROUND OF THE INVENTION

According to the prior art various technologies are used for the manufacturing of VDMOS transistors. A single VDMOS cell as a base element of the VDMOS transistors is sufficiently exhaustively described in the literature and is considered as well known. A substantial part of the manufacturing process is the contacting of a composite of VDMOS cells, in particular the manner of contacting the gate electrode.

VDMOS cells are contacted at three locations. Firstly on the wafer back side or chip back side (across wide areas), respectively, and on the other hand at the wafer surface or chip surface at a restricted contact location. At the wafer surface or chip surface the gate and source/body contacts have to be realized. Both contact types of the wafer surface or chip surface require respective mask layers. In some technologies the source/body contact is fabricated by solely etching into the single-crystalline silicon. In this case, the usage of only one mask layer for both contact hole types is difficult. The problem resides in the fact that during the plasma etch process both contact hole types, i.e. the gate and the source/body contacts, are etched simultaneously. The depth of the etching of the source/body contact into the silicon is approximately of the same order of magnitude as the thickness of the polysilicon layer below the gate contact (about 0.3 micrometers to 0.5 micrometers), which is the electrical connection of the gate. At the end of the plasma etch process the layer thickness of the polysilicon in the area of the gate contact hole region approaches zero. On the other hand, for the source region it is also necessary to reduce the interlayer dielectric in the contact hole with respect to its lateral extension to a certain degree to obtain a sufficient contact. During this wet chemical etch process the source contact hole is enlarged towards the gate. This process is sufficiently described. The disadvantage of this technique resides in the fact that with the polysilicon being fully or partially removed in the gate contact hole the field oxide may be etched within the gate contact hole simultaneously. The etch process attacks the field oxide in the depth and under etches the polysilicon. In this manner, a deformed gate contact is formed, thereby possibly resulting in later consequences with respect to the reliability of the transistors. In U.S. Pat. No. 6,025,646 in FIG. 3d a deformed gate contact (detail 27b) is illustrated in a schematic manner.

SUMMARY OF THE INVENTION

It is an object of the present invention to provide a method for producing a VDMOS transistor such that the gate contacting of the single cell and thus of the transistor may be enhanced, that is, a constructively targeted total contact area is to be obtained with high reproducibility, thereby improving data correspondence and reliability of the device.

According to one aspect the object is solved by a method comprising:

Forming a first dielectric layer above a structure having a field oxide, an adjacent gate oxide layer and a polysilicon layer formed on the field oxide and the gate oxide layer; patterning the gate oxide layer, the polysilicon layer and the first dielectric layer so as to define a well region; forming a well region and a source region in the well region; depositing a second dielectric layer; forming a gate contact hole and a source/body contact hole in the second dielectric layer in a common etch process by using the first dielectric layer as a protection layer for avoiding the exposure of the polysilicon layer in the gate contact hole; etching a recess in the source/body contact hole by using the first dielectric layer in the gate contact hole as an etch stop layer; removing the first dielectric layer in the gate contact hole and removing material of the second dielectric layer in a common isotropic etch process.

According to the present invention a dielectric layer is formed which, on the one hand, may be etched during the back etching of the second dielectric layer together with this layer in an appropriate etch process and which may thus be removed corresponding to a region of the gate contact which, on the other hand, acts as an efficient etch stop layer during the plasma etching. In this manner, a high degree of integrity of the polysilicon is achieved, while allowing the back etching of the second dielectric layer that acts as an interlayer dielectric material in a reliable manner.

In a further embodiment etch characteristics of the isotropic etch process for the first dielectric layer are selected such that for a desired material removal of the second dielectric layer during the isotropic etch process the first dielectric layer in the gate contact hole is completely removed.

Hence, a reliable control of the process may be performed, wherein the desired exposure of a part of the source contact with concurrent total exposure of the polysilicon layer is achieved.

In a further embodiment the etching of a recess and the removal of the first dielectric layer are performed by using the same etch mask layer. This results in a very efficient process sequence, wherein the previously explained advantages are still obtained.

In a further embodiment the first and the second dielectric layers comprise silicon oxide. Hence, the first dielectric layer may be considered as a part of the interlayer dielectric material, thereby enabling an efficient design of the process flow while not changing the overall behaviour of the interlayer dielectric material so that a high degree of compatibility with conventional techniques is maintained.

In a further embodiment forming the gate contact hole and the body/source contact hole comprises:

Controlling the common etch process by using an endpoint detection that detects the exposure of the well region. In this manner, a reliable coverage of the polysilicon layer by the first dielectric layer in the contact hole may be ensured, even if the first and the second dielectric layers have a very similar behaviour during the etch process.

According to a further aspect the object is solved, wherein in particular an efficient process flow is achieved due to the usage of the same mask layer for the patterning of the contact holes, the formation of the recesses in the well region and the back etching of the interlayer dielectric material together with the removal of the first dielectric layer in the gate contact hole.

The claimed invention has the advantages that the additional first dielectric layer, which in some embodiments is provided as an oxide layer (silicon oxide substantially without other components, hereinafter this will be denoted as non-doped, for instance $SiO_2$ formed from TEOS) that is formed on the non-patterned polysilicon that protects the source/polysilicon layer during the silicon etching of the source/body contact. The layer is then removed during the back etching of the intermediate isolating (dielectric) layer, after which an undisturbed homogeneous contact area of the polysilicon is provided within the gate contact holes.

A further advantage resides in the fact that the method for producing both contact systems may be performed by using a single mask (photo mask).

The invention is explained and supplemented by using illustrative embodiments and referring to the drawings.

DESCRIPTION OF PREFERRED EMBODIMENTS

Figure 1:
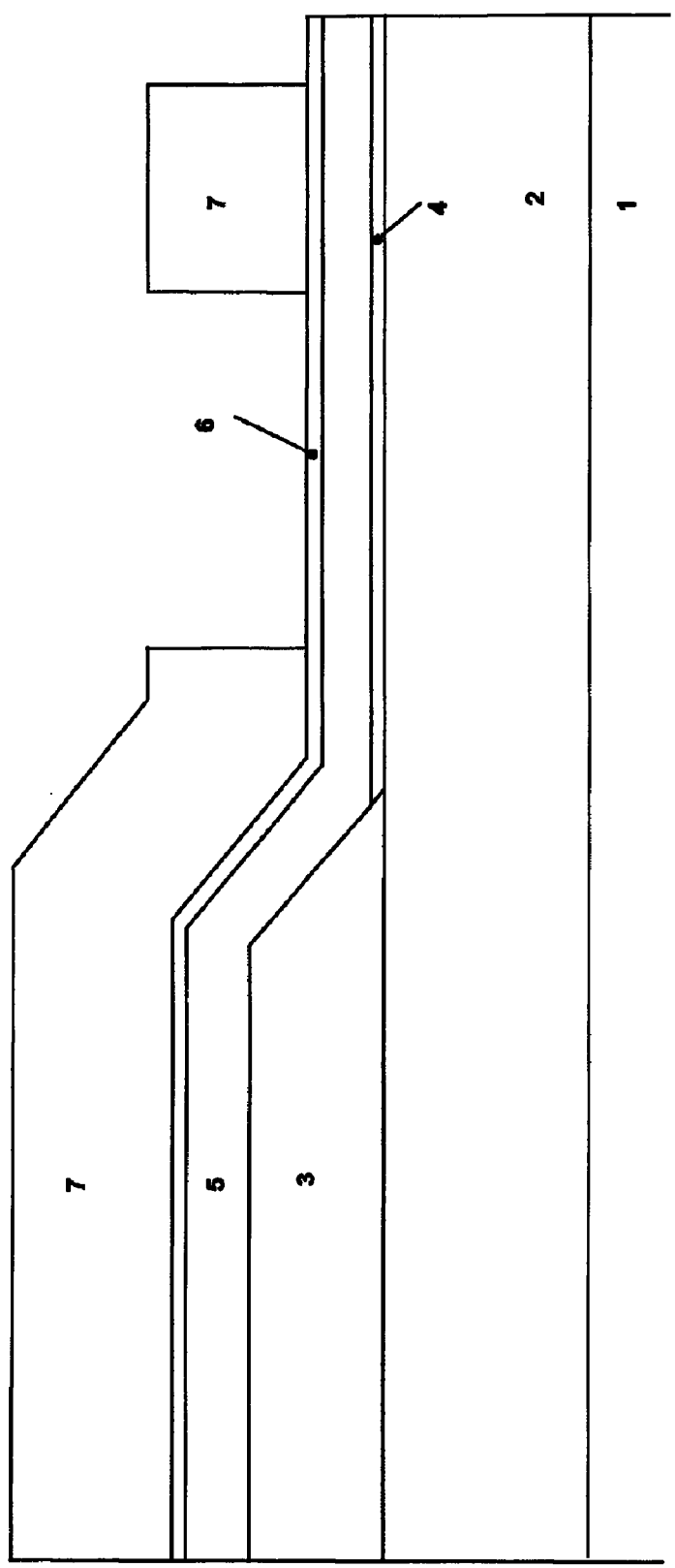
FIG. 1 to
FIG. 4 illustrate in schematic sectional view stages of a process flow for the fabrication of gate and source/body contacts according to an example of the invention.

FIG. 1 illustrates the edge structure of VDMOS transistors and a VDMOS cell in an early stage of the technological process. In one embodiment the base material consists of a highly doped silicon wafer 1 including an epitaxy layer 2 of the same type of doping. A thick oxide layer 3, which is photolithographically patterned and etched, is grown on the epitaxy layer. The patterned oxide layer 3 has, in addition to the function of defining the surface area of the VDMOS cells, also the function to reduce the drain voltage with respect to the chip surface and to form a buffer layer between the epitaxy layer 2 and the gate contact layer. After forming the gate oxide 4 the deposition and doping the polysilicon layer 5 as a gate contact layer a first dielectric layer 6, for instance in the form of an "non-doped" oxide layer, for instance on the basis of TEOS, is deposited. It is formed with respect to layer thickness and etch rate such that it will completely be removed from the gate contact hole toward the gate in the later process during the back etching of the source contact hole.

Figure 2:
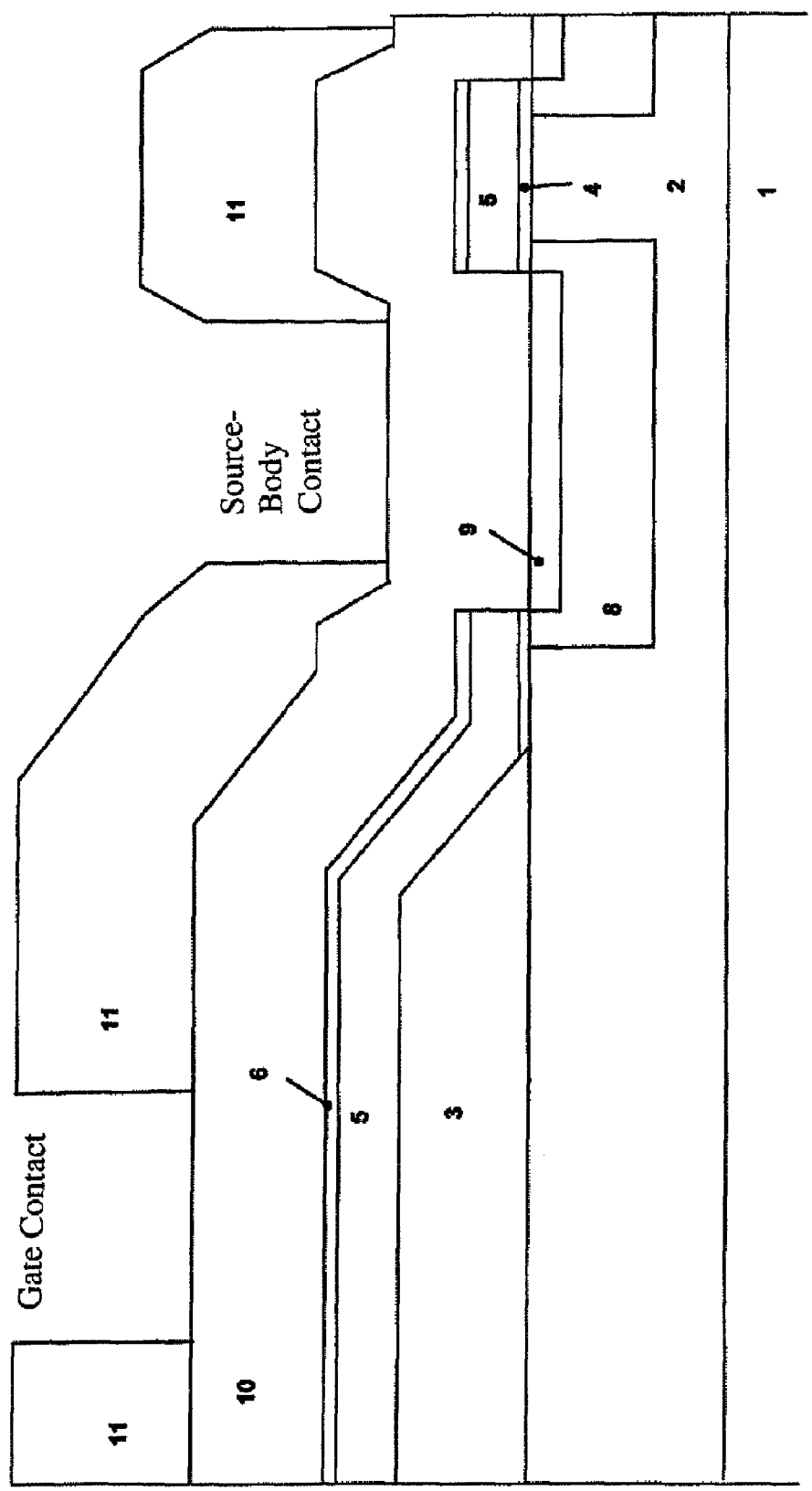

Using the subsequent mask 7 and the associated plasma etch processes the layers 5 and 6 are patterned and thus the areas for the well 8 are defined, as is shown in FIG. 2.

As shown in FIG. 2, after resist strip, that is, after removal of the mask 7, the so-called well region 8 is incorporated by implantation. The type of doping is opposite to that of the epitaxy layer. The subsequent annealing serves, among others, for the generation of the channel region under the polysilicon gate. In the same region the highly doped source terminal 9 is formed by implantation. In the next process step prior to forming the contact hole mask 11 the so-called interlayer dielectric material, for instance formed of boron phosphorous silicate glass or any other appropriate material, is deposited as a second dielectric layer 10.

Figure 3:
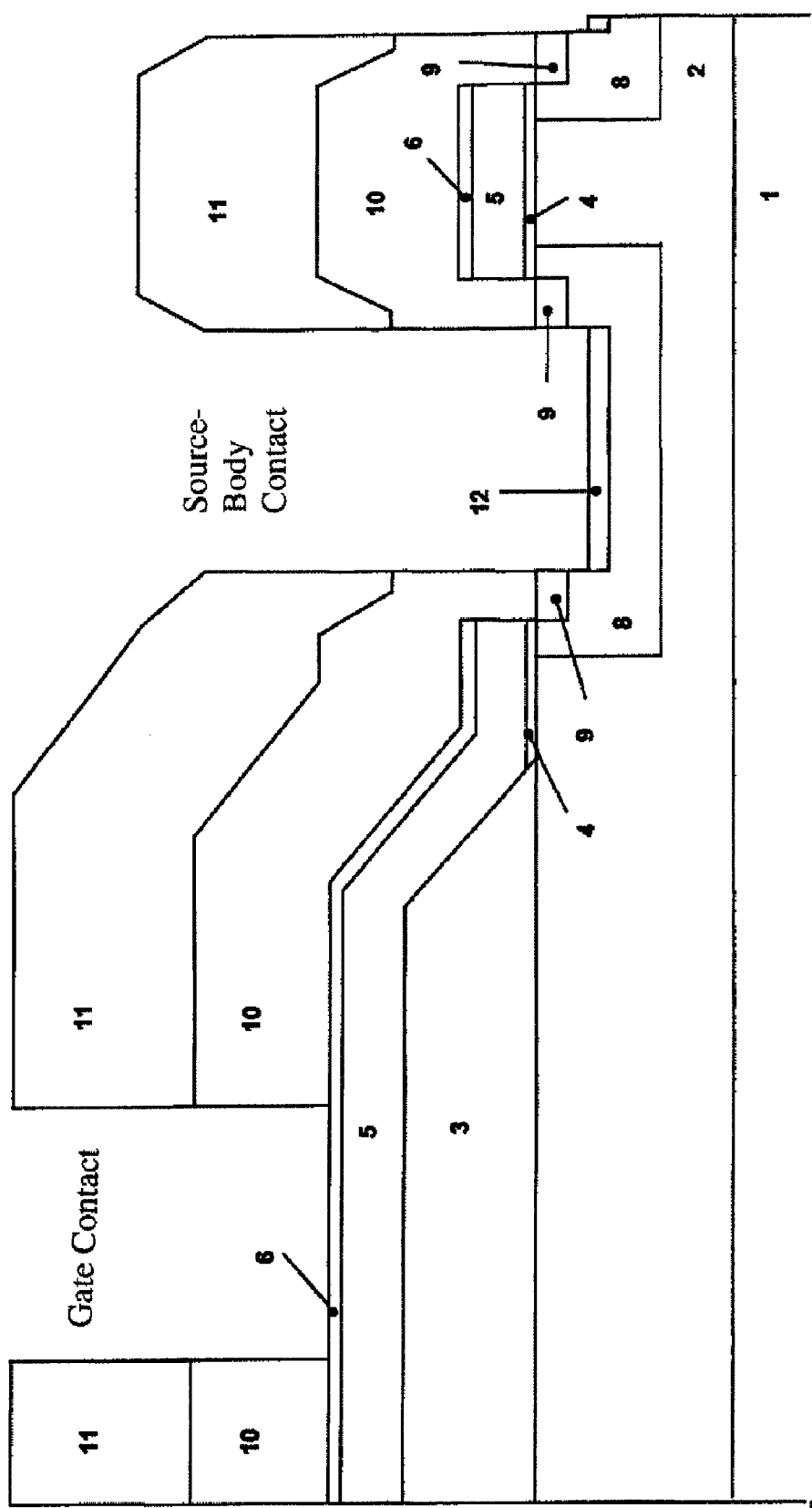

In FIG. 3 important details for the formation of the two contact hole types for the gate and source/body contacts are illustrated. First, by means of a plasma chemical etch process the interlayer dielectric material or the second dielectric layer 10 is patterned. By means of endpoint detection in the source/body contact hole an automatic end of the oxide etch process is realized after exposure of the silicon (not shown). Hence, at least a part of the first dielectric layer 6 remains, since the combined thickness of the first and second dielectric layers 6, 10 in the gate contact hole is greater than in the source/body contact hole, since there the first dielectric layer 6 is missing.

Hence, also with the same or a similar etch behaviour of the first and second dielectric layers 6, 10 a reliable coverage of the polysilicon layer is ensured. After the etch process the first dielectric layer, which may be provided as a non-doped oxide layer 6, may still be present within the gate contact hole regions. In a second subsequent etch process using a tool for etching silicon or polysilicon the source/body contact may be patterned several hundred nanometers into the substrate. Due to the high selectivity of the silicon etch process with respect to the first dielectric layer 6, which in one embodiment is provided as an oxide, the layer 6 is maintained within the gate contact area. After the patterning process a high dose implantation with dopants of the same conductivity type as used for the well provides for a low ohmic body contact 12.

Figure 4:
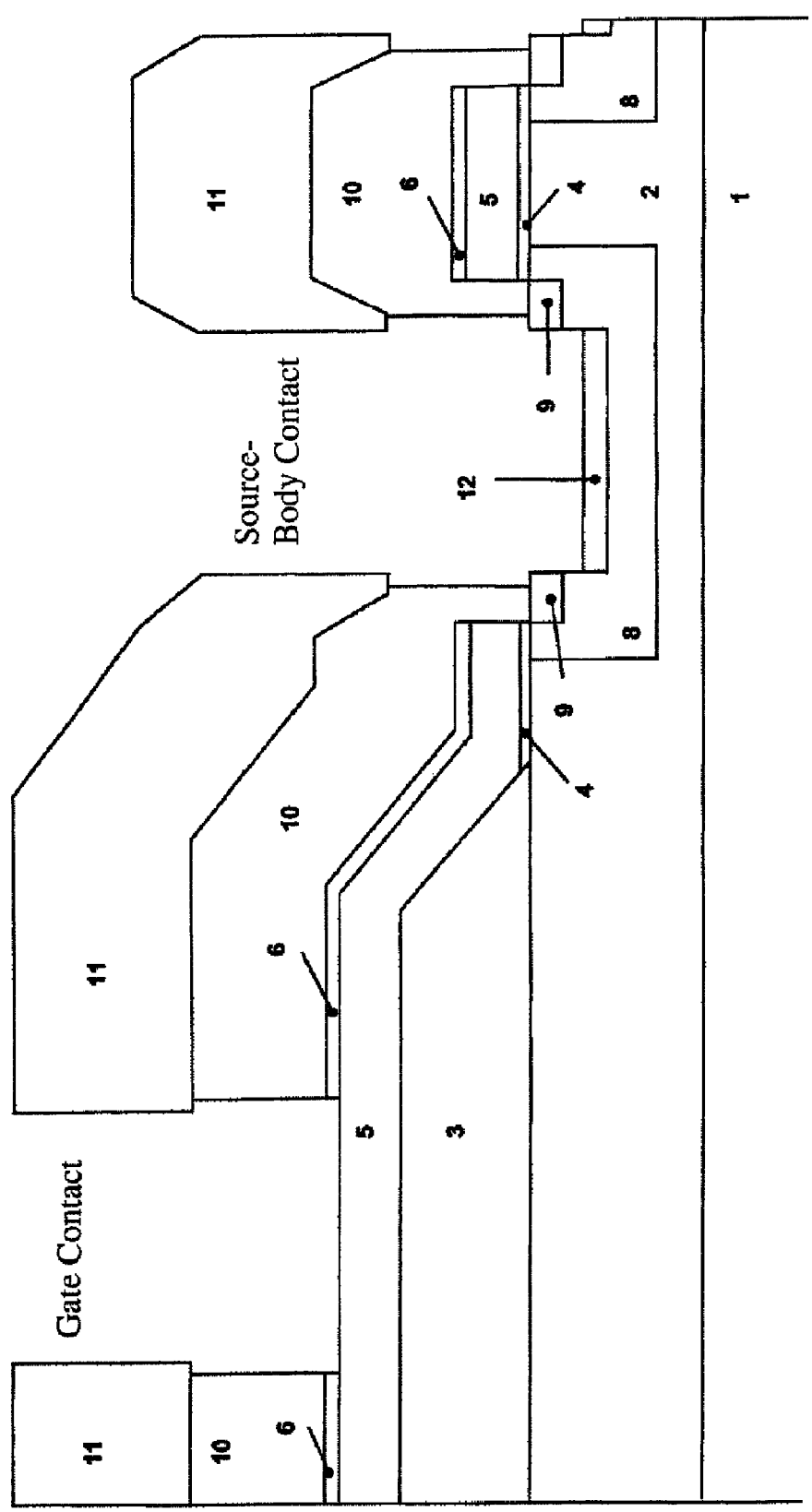

In order to increase the area of the source contact 9 the interlayer dielectric layer 10 has to be etched back in the source/body contact hole by a wet chemical or any other isotropic etch process. During the withdrawal of the interlayer dielectric material 10 caused by the isotropic etch process the layer 6 is concurrently completely removed within the gate contact hole, as is shown in FIG. 4. In addition to the source/body contact hole etched into the silicon the process described also provides for a non-disturbed planar polysilicon surface within the gate contact area.

The subsequent technological steps for realizing the VDMOS transistors, such as the removal of the resist layer and the formation of the metal and passivation level, are standard processes which are not relevant for the invention and which are considered as well known.

Table of Reference Numbers
1 Si substrate (highly doped)
2 Si epitaxy layer (doping corresponding to transistor parameters)
3 Oxide layer (grown)
4 Gate oxide layer
5 Polysilicon layer (doped)
6 Oxide layer (non-doped, deposited, for instance TEOS)
7 Resist mask (patterning of layers 5 and 6)
8 Well doping region
9 Source doping region
10 Intermediate isolating layer (for instance BPSG)
11 Resist mask (patterning of source and gate contacts)
12 Body implantation layer (highly doped)

We claim:
1. A method for producing a VDMOS transistor above a substrate having formed thereon a silicon layer, the method comprising the steps:
   forming a first dielectric layer on a polysilicon layer,
   forming a well region by pattering the first dielectric layer, the polysilicon layer and a gate insulation layer and implanting the silicon layer,
   depositing a second dielectric layer,
   forming a gate contact hole and a source/body contact hole by using a mask layer, wherein the source/body contact hole extends into the well region and wherein at least a part of the first dielectric layer prevents exposure of the polysilicon layer within the gate contact hole;
   etching the second dielectric layer and removing the first dielectric layer in the gate contact hole by using the mask layer.

2. The method according to claim 1, wherein the etching of the second dielectric layer and removing the first dielectric layer in the gate contact hole by using the mask layer are accomplished in a common etch process.

3. The method according to claim 1, wherein etch characteristics of the first dielectric layer are selected so as to ensure a complete removal of the first dielectric layer for a degree of back etching of the second dielectric layer.

4. The method according to claim 1, wherein the first dielectric layer is an oxide layer.

5. The method according to claim 1, wherein the second dielectric layer comprises silicon oxide.

6. The method according to claim 1, wherein forming the gate contact hole and the source/body contact hole comprises etching the second dielectric layer and etching the well region wherein the first dielectric layer acts as an etch stop in the gate contact hole.

* * * * *